(12) United States Patent
Chen

(10) Patent No.: US 7,468,555 B2
(45) Date of Patent: Dec. 23, 2008

(54) HEAT DISSIPATION STRUCTURE OF AN ELECTRONIC DEVICE

(75) Inventor: Cheng Te Chen, Hsin-Tien (TW)

(73) Assignee: Atio System, Inc., Taipei County (TW)

( * ) Notice: Subject to any disclaimer, the term of this patent is extended or adjusted under 35 U.S.C. 154(b) by 0 days.

(21) Appl. No.: 11/182,823

(22) Filed: Jul. 18, 2005

(65) Prior Publication Data

US 2006/0267192 A1 Nov. 30, 2006

(30) Foreign Application Priority Data

May 31, 2005 (TW) .............................. 94208987 U

(51) Int. Cl.
*H01L 23/34* (2006.01)
(52) U.S. Cl. ...................................... 257/712; 257/722
(58) Field of Classification Search ................. 257/712, 257/722, 724
See application file for complete search history.

(56) References Cited

U.S. PATENT DOCUMENTS 6,936,919 B2 * 8/2005 Chuang et al. .............. 257/717

* cited by examiner

*Primary Examiner*—Mark Prenty
(74) *Attorney, Agent, or Firm*—Rosenberg, Klein & Lee

(57) ABSTRACT

Disclosed is a heat dissipation structure, which includes a housing that houses a circuit board having active components, a heat sink formed integral with one side of the housing for supporting the circuit board and having radiation fins on the outside, a plurality of heat pads provided at the inside wall of the heat sink corresponding to the active components, and heat conducting bonding layers bonded between the heat pads and the active components for quick dissipation of heat from the active components into the outside open air through the heat pads and the heat sink.

18 Claims, 4 Drawing Sheets

HEAT DISSIPATION STRUCTURE OF AN ELECTRONIC DEVICE

BACKGROUND OF THE INVENTION

1. Field of the Invention

The present invention relates to an electronic device and more particularly, to a heat dissipation structure of an electronic device, which dissipates heat from the passive components of the electronic device efficiently without the use of an electric fan.

2. Description of the Related Art

Following fast development of technology, a variety of advanced and sophisticated electronic devices have been created to make our life better. Regular electronic devices may use a number of active components that produce heat during operation. In order to maintain optimum working atmosphere for these active components, heat must be quickly carried away from these active components during working. According to study, the service life of will be shortened by one half when increasing the working temperature by 10° C. Conventionally, electric fans are used with mini heat sinks or heat pipes for carrying heat away from the active components of an electronic device. When a mini heat sink is used, it is directly mounted on the active component, and a corresponding electric fan is provided to induce currents of air toward the mini heat sink and the active component. However, an electric fan consumes much electric energy, and causes noises during operation. When a heat pipe is used with an electric fan that causes a convection of air, dust tends to be accumulated inside the electronic device. Further, the use of an electric fan with a mini heat sink or heat pipe requires much installation space in the electronic device.

Therefore, it is desirable to provide a heat dissipation structure for electronic device that eliminates the aforesaid drawbacks.

SUMMARY OF THE INVENTION

The present invention has been accomplished under the circumstances in view. According to one aspect of the present invention, the heat dissipation structure comprises a housing that has one panel (side) formed of a heat sink for dissipating heat from the active components of the circuit board housed inside the housing. The heat sink has radiation fins perpendicularly protruded from the flat outside wall thereof to increase the heat dissipation area of the heat sink.

According to another aspect of the present invention, the heat sink is directly formed integral with the housing to support the circuit board and the dissipate heat from the active components of the circuit board. Because no electric fan or heat pipe is used, the size of the electronic device can be minimized.

According to still another aspect of the present invention, the heat dissipation structure can be used in a horizontal, vertical, or wall-mounting type computer, home video system, or any of a variety of electronic devices.

According to the preferred embodiment of the present invention, the heat dissipation structure comprises a housing, which houses a circuit board having at least one active component and a plurality of passive components; a heat sink formed integral with a part of the housing, the heat sink having a flat inside wall, a flat outside wall opposite to the flat inside wall, and a plurality of radiation fins provided at the flat outside wall; at least one heat pad fixedly provided at the flat inside wall of the heat sink corresponding to the at least one active component of the circuit board in the housing; and at least one heat conducting bonding layer connected between the at least one heat pad and the at least one active component.

DETAILED DESCRIPTION OF THE PREFERRED EMBODIMENT

Figure 1:
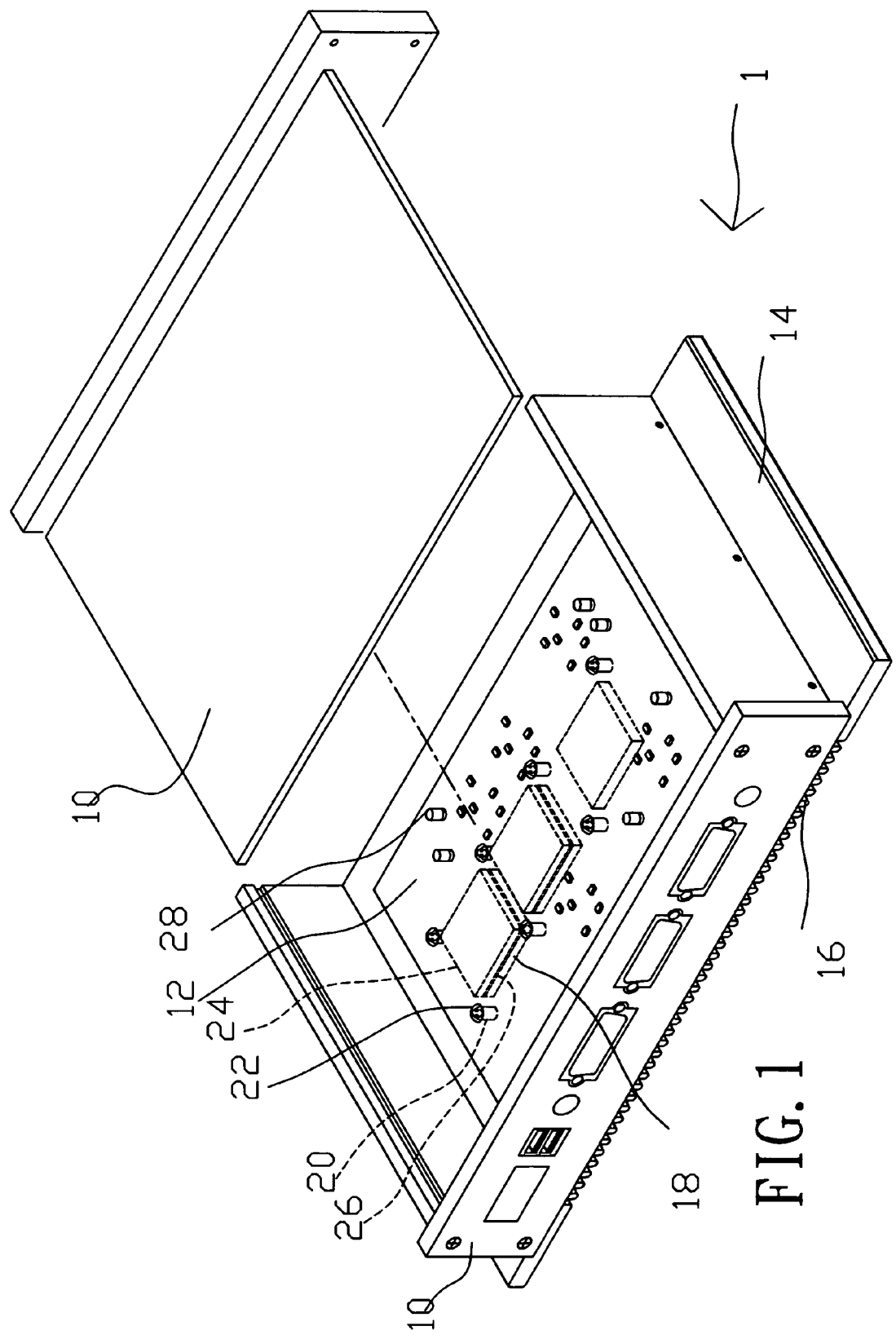
FIG. 1 is an exploded view of the preferred embodiment of the present invention.
Figure 2:
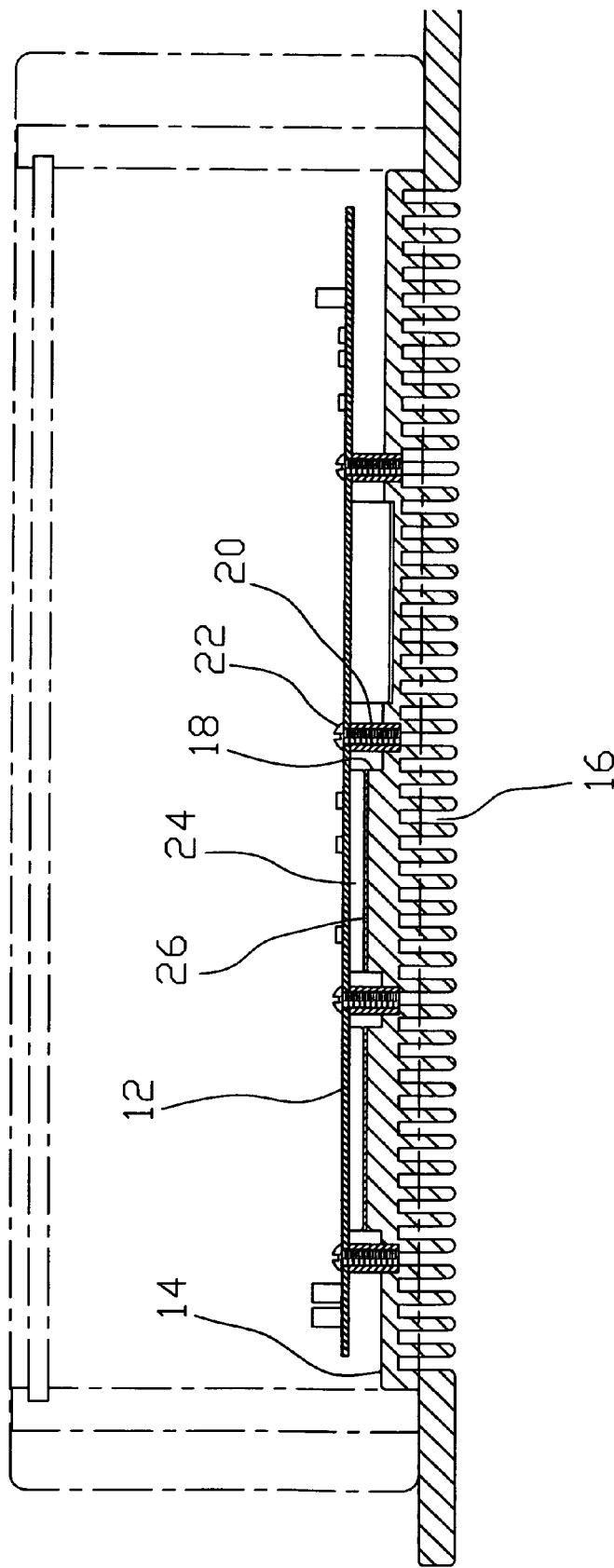
FIG. 2 is a schematic sectional view of the preferred embodiment of the present invention.

Referring to FIGS. 1 and 2, a heat dissipation structure 1 in accordance with the present invention is shown used in an electronic device comprising a heat conducting housing 10, which accommodates a circuit board 12. The heat conducting housing 10 has one sidewall formed of a heat sink 14, which supports the circuit board 12 and has upright radiation fins 15 that increase the heat dissipation surface of the heat sink 14. The upright radiation fins 15 are perpendicularly protruded from the flat outside wall of the heat sink 14 and arranged in rows. Further, the housing 10 has at least one communication port and at least one indicator light provided at one side.

Figure 3:
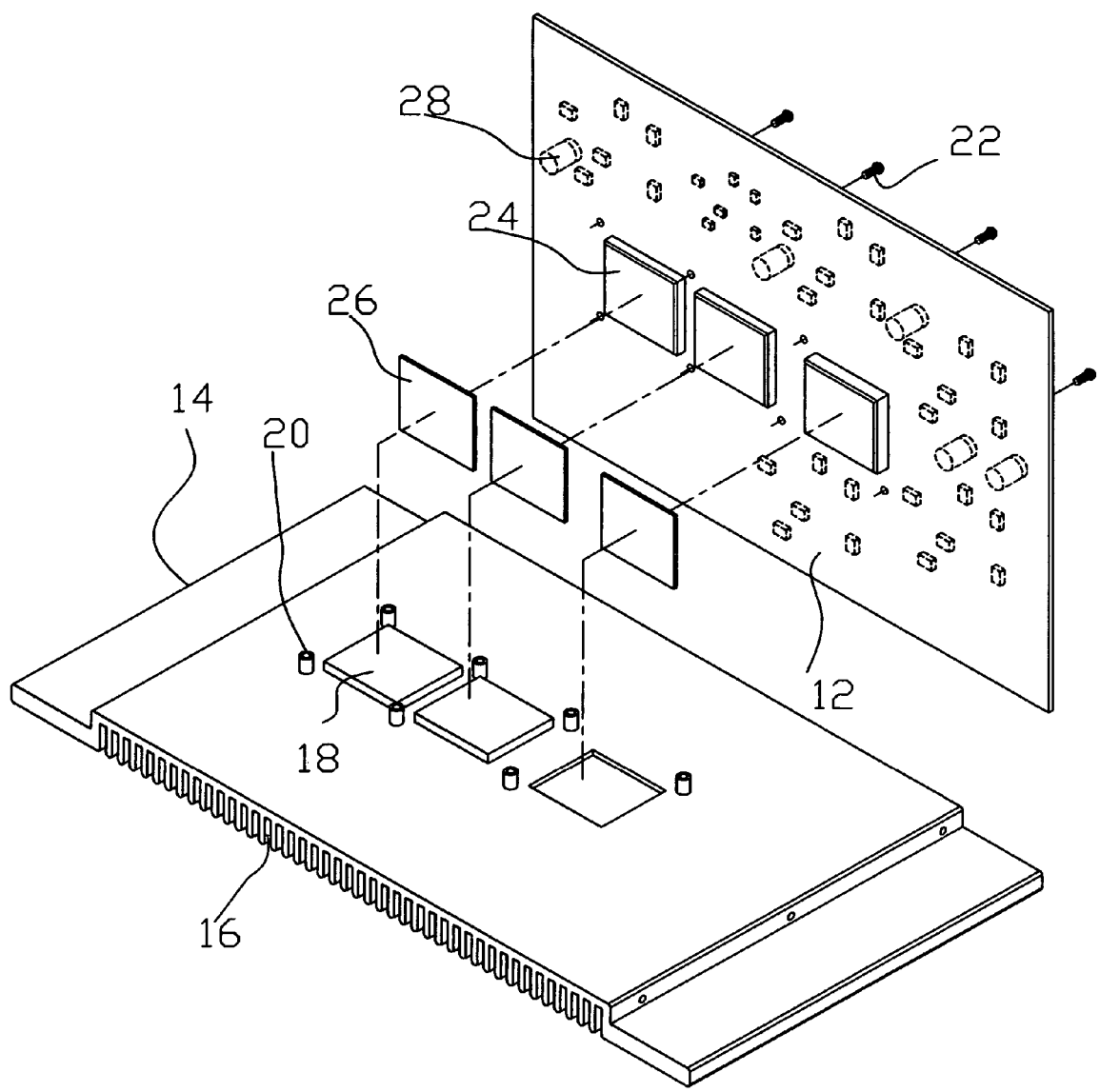
FIG. 3 is an exploded view of a part of the present invention, showing the relationship between the heat sink and the circuit board.
Figure 4:
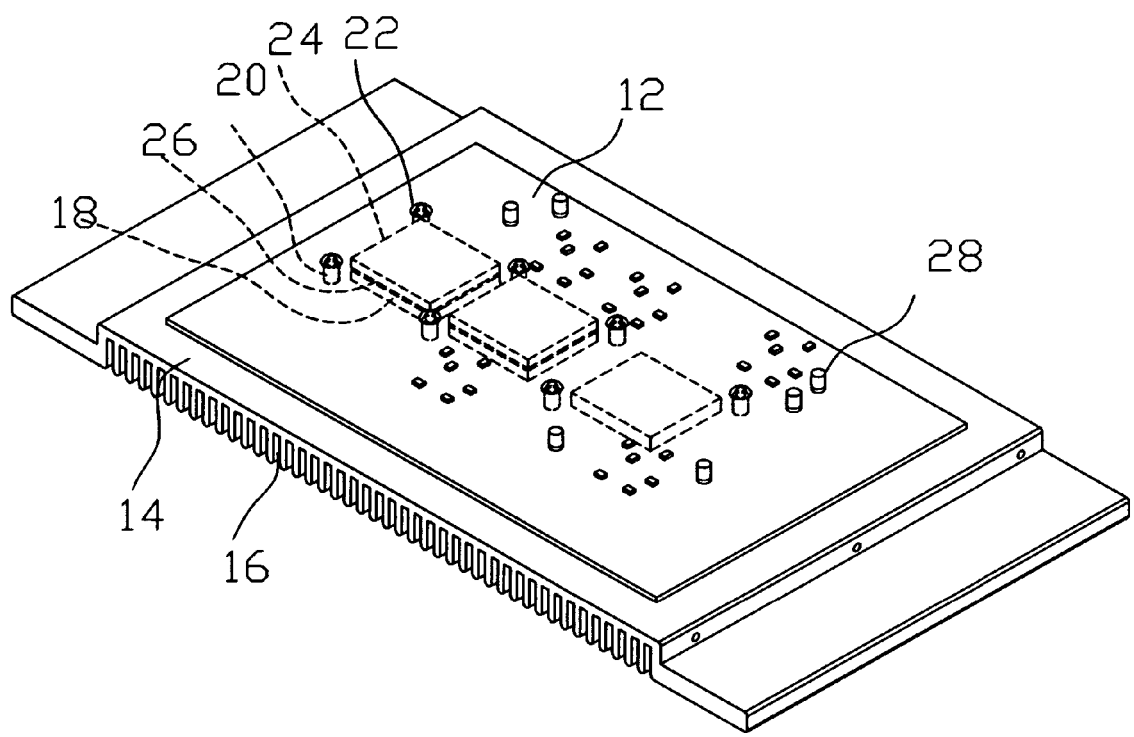
FIG. 4 corresponds to FIG. 3, showing the circuit board fastened to the heat sink.

Referring to FIGS. 3 and 4, the circuit board 12 comprises a plurality of active components, for example, three active components 24, and a plurality of passive components 28. The active components 24 are provided at the bottom side of the circuit board 12. The passive components 28 can be provided at the top side or the bottom side of the circuit board 12. According to the present preferred embodiment, the active components 24 and the passive components 28 are provided at the bottom side of the circuit board 12. The heat sink 14 comprises a plurality of heat pads, for example, three heat pads 18 disposed at the flat inside wall (opposite to the radiation fins 16) corresponding to the active components 24 of the circuit board 12, a plurality of mounting posts 20 protruded from the top side around the heat pads 18. Fastening members, for example, screws 22 are respectively fastened to the mounting posts 20 to affix the circuit board 12 to the mounting posts 20, keeping the active components 24 in contact with the heat pads 18 respectively. Further, heat conducting bonding layers 26 may be bonded between the active components 24 and the heat pads 18. By means of the thickness of the heat conducting bonding layers 26 and the heat pads 18, the circuit board 12 is kept in parallel to the heat sink 14 perfectly.

The aforesaid heat conducting bonding layers 26 can be formed of a heat conducting glue or heat conducting metal sheet. The heat pads 18 can be made of copper, or metal alloy having a high coefficient of heat transfer. The housing 10 and the heat sink 14 are preferably made of light metal or metal alloy having a high coefficient of heat transfer. By means of smokestack theory, heat is quickly dissipated from the active components 24 of the circuit board 12 into the outside air through the heat sink 14 and the radiation fins 16 via the heat pads 18 and the heat conducting bonding layers 26 during the operation of the electronic device. The active components 24 of the circuit board 12 can be CPU, Southbridge chip, and/or Northbridge chip. A hard disk drive and memory means may be mounted in the housing 10 and electrically connected to the circuit board 12, so that the electronic device works as a small computer for use in IT (Information Technology) industry.

As indicated above, the invention provides a heat dissipation structure used in an electronic device. The invention dissipates heat quickly during the operation of the electronic device. Because no electric fan is necessary on dissipating heat during the operation of the electronic device, the invention saves much power consumption. Because no electric fan is used, the electronic device can be made relatively smaller.

Further, the heat dissipation structure of the present invention can be used in a horizontal, vertical, or wall-mounting type computer, video system, server, or display monitor.

Although a particular embodiment of the invention has been described in detail for purposes of illustration, various modifications and enhancements may be made without departing from the spirit and scope of the invention.

What the invention claimed is:

1. A heat dissipation structure used in an electronic device, comprising:
    a housing, which houses a circuit board having at least one active component and a plurality of passive components wherein said housing comprises at least one communication port and at least one indicator light;
    a heat sink formed integral with a part of said housing, said heat sink having a flat inside wall, a flat outside wall opposite to said flat inside wall, and a plurality of radiation fins provided at said flat outside wall;
    at least one heat pad fixedly provided at said flat inside wall of said heat sink corresponding to said at least one active component of said circuit board in said housing; and
    at least one heat conducting bonding layer connected between said at least one heat pad and said at least one active component.

2. A heat dissipation structure used in an electronic device, comprising:
    a housing, which houses a circuit board having at least one active component and a plurality of passive components;
    a heat sink formed integral with a part of said housing, said heat sink having a flat inside wall, a flat outside wall opposite to said flat inside wall, and a plurality of radiation fins provided at said flat outside wall wherein said heat sink comprises a plurality of upright mounting posts perpendicularly protruded from said flat inside wall and fastened to said circuit board with a respective fastening member;
    at least one heat pad fixedly provided at said flat inside wall of said heat sink corresponding to said at least one active component of said circuit board in said housing; and
    at least one heat conducting bonding layer connected between said at least one heat pad and said at least one active component.

3. A heat dissipation structure used in an electronic device, comprising:
    a housing, which houses a circuit board having at least one active component and a plurality of passive components;
    a heat sink formed integral with a part of said housing, said heat sink having a flat inside wall, a flat outside wall opposite to said flat inside wall, and a plurality of radiation fins provided at said flat outside wall;
    at least one heat pad fixedly provided at said flat inside wall of said heat sink corresponding to said at least one active component of said circuit board in said housing; and
    at least one heat conducting bonding layer connected between said at least one heat pad and said at least one active component wherein said at least one heat conducting bonding layer is respectively formed of a heat conducting metal sheet.

4. The heat dissipation structure as claimed in claim 1, wherein said heat sink and said radiation fins are made of one of a group of heat conducting materials including light metal and light metal alloy.

5. The heat dissipation structure as claimed in claim 2, wherein said passive components and said at least one active component are respectively disposed at a bottom side of said circuit board.

6. The heat dissipation structure as claimed in claim 2, wherein said passive components and said at least one active component are respectively disposed at two opposite sides of said circuit board.

7. The heat dissipation structure as claimed in claim 2, wherein said upright mounting posts of said heat sink are spaced around said at least one heat pad.

8. The heat dissipation structure as claimed in claim 1, wherein said at least one heat pad is respectively made of one of a group of heat conducting materials including copper and light metal alloy.

9. The heat dissipation structure as claimed in claim 1, wherein said at least one heat conducting bonding layer is respectively formed of a heat conducting glue.

10. The heat dissipation structure as claimed in claim 1, wherein said radiation fins are perpendicularly protruded from said flat outside wall and arranged in rows.

11. The heat dissipation structure as claimed in claim 1, wherein said electronic device is a vertical type electronic device.

12. The heat dissipation structure as claimed in claim 1, wherein said electronic device is a horizontal type electronic device.

13. The heat dissipation structure as claimed in claim 1, wherein said electronic device is a wall-mounting type electronic device.

14. The heat dissipation structure as claimed in claim 1, wherein said electronic device is a computer.

15. The heat dissipation structure as claimed in claim 1, wherein said electronic device is a video system.

16. The heat dissipation structure as claimed in claim 1, wherein said electronic device is a server.

17. The heat dissipation structure as claimed in claim 1, wherein said electronic device is a display monitor.

18. The heat dissipation structure as claimed in claim 1, wherein said at least one active component includes a CPU, a Southbridge chip, and a Northbridge chip; said housing further houses a hard diskdrive and memory means, said hard diskdrive and memory means being respectively electrically connected to said circuit board.

\* \* \* \* \*